(12) United States Patent  
Chung

(10) Patent No.: US 7,088,125 B2  
(45) Date of Patent: Aug. 8, 2006

(54) REDUCING COUPLING NOISE IN AN OUTPUT DRIVER

(75) Inventor: In-young Chung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 10/888,010

(22) Filed: Jul. 12, 2004

(65) Prior Publication Data

US 2005/0007146 A1 Jan. 13, 2005

(30) Foreign Application Priority Data

Jul. 12, 2003 (KR) .................. 10-2003-0047540

(51) Int. Cl.
*H03K 19/003* (2006.01)

(52) U.S. Cl. .............................. 326/26; 327/27; 327/34

(58) Field of Classification Search ................... 326/26, 326/27

See application file for complete search history.

(56) References Cited

U.S. PATENT DOCUMENTS 4,862,018 A * 8/1989 Taylor et al. .................. 326/27

5,917,361 A * 6/1999 Wong et al. ................. 327/391
6,169,421 B1 * 1/2001 Bryan et al. .................. 326/83

FOREIGN PATENT DOCUMENTS

JP         2001-177388       6/2001

* cited by examiner

*Primary Examiner*—Vibol Tan
(74) *Attorney, Agent, or Firm*—Volentine Francos & Whitt, PLLC

(57) ABSTRACT

An output driver may reduce coupling noise. The output driver may include a first transistor, a second transistor, and/or a noise-eliminating portion. The first transistor may have a first terminal connected to a first voltage, a second terminal connected to a first node, and a gate to which data is applied. The second transistor may have a first terminal connected to the first node and a second terminal connected to an output node. The noise-eliminating portion may be connected between the gate of the first transistor and a gate of the second transistor. The noise-eliminating portion may be a capacitor. The capacitor may substantially eliminate coupling noise introduced at the gate of the second transistor, due to coupling capacitance between the gate of the second transistor and the output node and coupling capacitance between the gate of the second transistor and the first node, by using the data applied to the gate of the first transistor.

14 Claims, 3 Drawing Sheets

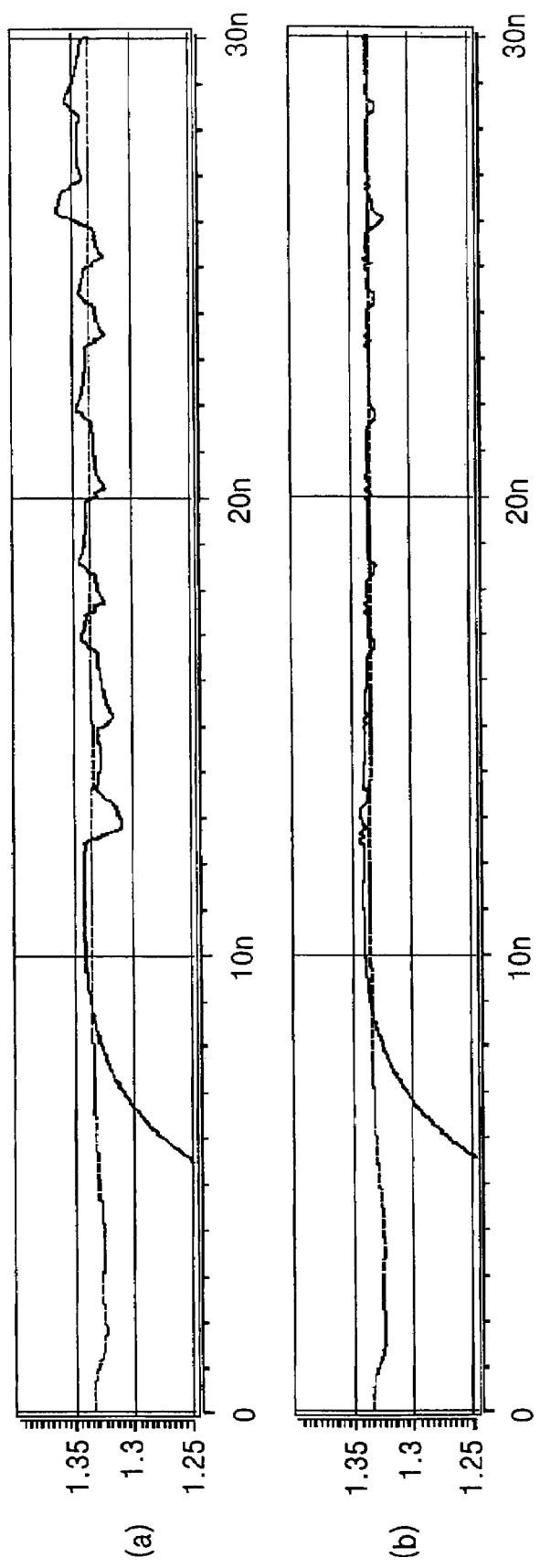

REDUCING COUPLING NOISE IN AN OUTPUT DRIVER

BACKGROUND OF THE INVENTION

1. Field of the Invention

Embodiments of the present invention relate to an output driver with reduced coupling noise.

This application claims the priority of Korean Patent Application No. 2003-47540, filed on Jul. 12, 2003, in the Korean Intellectual Property Office, the disclosure of which is incorporated herein in its entirety by reference.

2. Description of the Related Art

A current-mode output driver may have a relatively high output resistance when it is turned on or off. Accordingly, a current-mode output driver is beneficial for channel impedance matching. A current-mode output driver may be necessary in some types of Rambus dynamic random access memory (Rambus DRAM) and is commonly used in chip-to-chip connection systems.

FIG. 1 illustrates a current-mode output driver 100, which includes a NMOS transistor NTR connected between a channel and a ground voltage VSS. A voltage level at a gate of the NMOS transistor NTR is based on a logic level of data DATA. A drain current Id is generated according to the voltage level at the gate of this NMOS transistor NTR. The drain current Id flows through the channel or a conducting wire. However, when the current-mode output driver 100 is turned on (when the drain current Id flows), the output resistance must be high. As a result, the NMOS transistor NTR of the current-mode output driver 100 must be operating in saturation when the current-mode output driver is turned on.

In order for the NMOS transistor NTR of the current-mode output driver 100 to operate in saturation, the voltage level at the gate of the NMOS transistor NTR must be less than a voltage level at a drain of the NMOS transistor NTR. The voltage level at the drain of the NMOS transistor NTR is equal to the sum of a turn-on voltage level of the channel and a threshold voltage of the NMOS transistor NTR. Accordingly, if the data DATA, having a supply voltage level, is applied to the gate of the NMOS transistor NTR, then a low voltage is generated at the drain of the NMOS transistor NTR (in the channel). Accordingly, the condition that the voltage at the gate should be less than the voltage at the drain will not be satisfied, resulting in a low output resistance of the current-mode output driver 100.

Consequently, when an output driver includes only a single MOS transistor, as shown in FIG. 1, a gate of the MOS transistor can not be charged to a ground voltage level or the supply voltage level, according to the level of data applied to the gate of the MOS transistor. Instead, the gate of the MOS transistor must be charged to the ground voltage level or a specific voltage level VA. The specific voltage level VA is between the threshold voltage of the MOS transistor and the supply voltage. However, the new voltage level VA, requiring a large amount of current, must be internally generated, there may be disadvantageous chip size and power consumption consequences.

FIG. 2 illustrates a stacked current-mode output driver 200. The stacked current-mode output driver 200 includes first NMOS transistor NTR1 and second NMOS transistor NTR2 that are connected serially between a channel and a ground voltage VSS. A gate voltage ENVG, maintained at a specific level, is applied to a gate of the second transistor NRT2 connected to the channel. Data DATA that swings between a supply voltage VDD and the ground voltage VSS is applied to a gate of the first transistor NTR1.

Once the gate voltage ENVG is applied to the gate of the second transistor NTR2, the second transistor NTR2 is maintained in a saturation state and an output resistance of the stacked current-mode output driver 200 is maintained at a high level. Since the gate voltage ENVG applied to the gate of the second transistor NTR2 is maintained at a specific level, irrespective of changes in the data DATA, the amount of supplied current does not need to be large. Thus, the structure of the stacked current-mode output driver 200 of FIG. 2 is advantageous for generating and controlling accurate voltages.

In a Rambus DRAM, the gate voltage ENVG may be lowered to the ground voltage VSS in a stand-by state and increased to a voltage Vgate in an active-read state, making the stacked current-mode output driver 200 available. Since the data DATA applied to the gate of the first transistor NTR1 swings between the ground voltage VSS and the supply voltage VDD, driving current of the stacked current-mode output driver 200 is determined by the voltage Vgate. In other words, the driving current of the stacked current-mode output driver 200 is effected by the change in the voltage Vgate, which may have an influence upon the amplitude and timing of signals on the channel.

Coupling noise introduced at the gate of the second transistor NTR2 exerts a negative influence on the characteristics of signals on the channel. To minimize such coupling noise, a large-capacitance capacitor may be included between the gate of the second transistor NTR2 and the ground voltage VSS.

FIG. 3 illustrates coupling noise generated in the stacked current-mode output driver 200 of FIG. 2. Referring to FIG. 3, when the level of the data DATA is 1 or 0, a drain node of the second transistor NTR2 (e.g. the channel) may experience a voltage swing of about 800 mV. Also, a first node N1 between the first transistor NTR1 and the second transistor NTR2 may experience a voltage swing of about 500 mV. These voltage swings may vary with the design of the output driver. In other words, when a voltage at the gate of the first transistor NTR1 increases to the supply voltage VDD, the channel undergoes a voltage drop of 800 mV and the first node N1 undergoes a voltage drop of 500 mV. Such changes in the voltages of the channel and the first node N1 effect the voltage at a gate node GNODE of the second transistor NTR2 through parasitic capacitances Cgd and Cgs of the second transistor NTR2. The amount of change in voltage at the gate node GNODE of the second transistor NTR2 (i.e. a coupling voltage Vcoup) may be approximated by the following equation.

$$Vcoup = (800\ mV * Cgd + 500\ mV * Cgs)/(C + Cgd + Cgs) \quad (1)$$

The number of transmission paths of the coupling voltage Vcoup defined in Equation 1 is two. That is, one transmission path is the channel that experiences the voltage swing of 800 mV and the other transmission path is the first node N1 that experiences the voltage swing of 500 mV. The amount of coupling noise is proportional to the product of the amount of voltage change at nodes by the mutual capacitances Cgd and Cgs. Since Cgs is generally larger than Cgd, most of the coupling noise is introduced by the first node N1.

As can be seen from Equation 1, when a capacitor C, with a capacitance much larger than the mutual capacitances Cgd and Cgs, is connected between the gate node GNODE of the second transistor NTR2 and the ground voltage VSS, it is possible to minimize the coupling voltage Vcoup. However, since sizes of the first transistor NTR1 and the second transistor NTR2 of an output driver 300 of FIG. 3 may be relatively large, the parasitic capacitances Cgd and Cgs may also be relatively large. Accordingly, there are limitations on the layout of the capacitor C between the gate node GNODE of the second transistor NTR2 and the ground voltage VSS, because the capacitance of the capacitor C should be larger than Cgd and Cgs.

The large-capacitance capacitor C also interferes with charging and discharging of the gate node GNODE of the second transistor NTR2 to a level of Vgate or Vss. Accordingly, in a Rambus DRAM, a coupling voltage Vcoup of tens of mV is generated at the gate node GNODE of the second transistor NTR2. In the Rambus DRAM, the gate node GNODE of the second transistor NTR2 may be shared with 8 output drivers (not shown). As a result, when all of the output drivers are pulled down, the coupling voltage Vcoup at the gate node GNODE of the second transistor NTR2 decreases, and as a result, output time tQ of the data DATA is delayed. In contrast, when one output driver is pulled down and the other 7 output drivers are pulled up, the coupling voltage Vcoup at the gate node GNODE of the second transistor NTR2 increases. As a result, the output time tQ of the data DATA moves forward in time. In other words, the coupling noise changes the output time tQ of the data DATA, thus interfering with high-speed signal transmission between chips.

SUMMARY OF THE INVENTION

Embodiments of the present invention provide an output driver which reduces coupling noise. Other embodiments provide a method of reducing coupling noise generated in an output driver.

According to aspects of embodiments of the present invention, an output driver, which reduces coupling noise, comprises a first transistor, a second transistor, and a noise-eliminating portion. The first transistor may have a first terminal connected to a first voltage, a second terminal connected to a first node, and a gate to which data is applied. The second transistor has a first terminal connected to the first node and/or a second terminal connected to an output node. The noise-eliminating portion may be connected between the gate of the first transistor and a gate of the second transistor. In embodiments, the noise-eliminating portion may be a capacitor. The capacitor may eliminate coupling noise introduced at the gate of the second transistor due to coupling capacitance between the gate of the second transistor and the output node and coupling capacitance between the gate of the second transistor and the first node, by using the data applied to the gate of the first transistor. The first voltage may be a ground voltage. The first transistor and the second transistor may be NMOS transistors.

According to aspects of embodiments of the present invention, an output driver, which reduces coupling noise, includes a first transistor and a second transistor serially connected between a first voltage and an output node. The output driver comprises a noise-eliminating portion for reducing coupling noise introduced at a gate of the second transistor. The noise-eliminating portion may be connected between the gate of the first transistor and the gate of the second transistor. In embodiments, the noise-eliminating portion may be a capacitor.

According to aspects of embodiments of the present invention, an output driver transfers data input to an input node to an output node and reduces coupling noise. The output driver may comprise a first node, a first driver, a second driver, and a noise-eliminating portion. The first driver may be connected between the first node and a first voltage and may drive the data input to the input node to the output node through the first node. The second driver may be connected between the output node and the first node and connects the first node and the output node in response to a gate voltage applied to a control node. The noise-eliminating portion may be connected between the input node and the control node and eliminates coupling noise introduced at the control node. In embodiments, the noise-eliminating portion is a capacitor. The capacitor may eliminate coupling noise introduced at the control node of the second driver due to coupling capacitance between the control node of the second driver and the output node and coupling capacitance between the control node of the second driver and the first node, by using the data applied to the input node. The first voltage may be a ground voltage.

According to aspects of embodiments of the present invention, a method reduces coupling noise introduced at a control node, where data input to an input node is output to an output node through a first node, in response to a gate voltage applied to the control node. The method may comprise eliminating the coupling noise introduced at the control node by connecting a capacitor between the control node and the input node and/or outputting the data input to the input node to the output node through the first node. The connecting of the capacitor between the control node and the input node may eliminate the coupling noise introduced at the control node, by using the data applied to the input node.

BRIEF DESCRIPTION OF THE DRAWINGS

Example

Example FIGS. 5A and 5B are graphs showing changes in waveforms output from a gate of a second transistor.

DETAILED DESCRIPTION OF THE INVENTION

Figure 4:
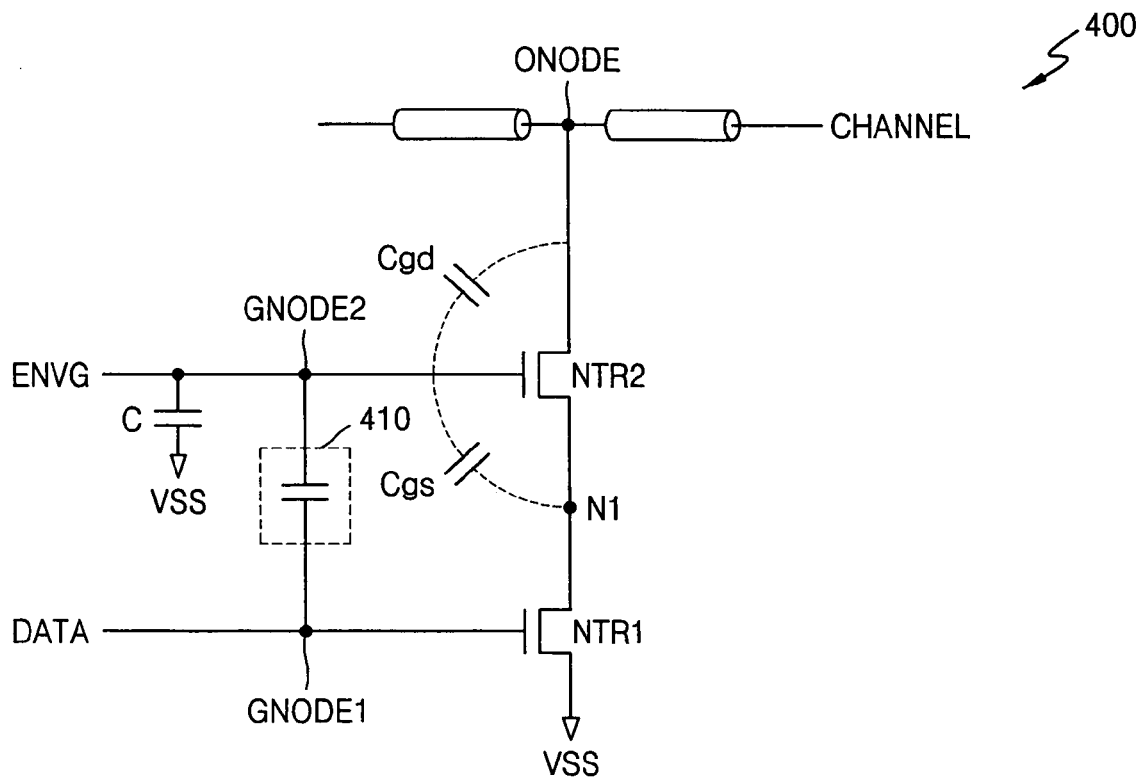
FIG. 4 is a circuit diagram of an output driver.

Example FIG. 4 illustrates an output driver, according to embodiments of the present invention. Referring to FIG. 4, an output driver 400, according to embodiments of the present invention, includes a first transistor NTR1, a second transistor NTR2, and a noise-eliminating portion 410. A first terminal of the first transistor NTR1 is connected to a first voltage VSS and a second terminal of the first transistor NTR1 is connected to a first node N1. Data DATA is applied to a gate GNODE1 of the first transistor NTR1. The first voltage VSS is a ground voltage. The first transistor NTR1 is an NMOS transistor. A first terminal of the second transistor NTR2 is connected to the first node N1 and a second terminal of the second transistor NTR2 is connected to an output node ONODE. The second transistor NTR2 is a NMOS transistor. The noise-eliminating portion 410 is connected between the gate GNODE1 of the first transistor NTR1 and a gate GNODE2 of the second transistor NTR2. In embodiments, the noise-eliminating portion 410 may be a capacitor.

In embodiments, the data DATA applied to the gate GNODE1 of the first transistor NTR1 is utilized by noise eliminating portion 410 (e.g. a capacitor) to eliminate coupling noise (e.g. due to capacitances Cgd and Cgs), that is introduced at the gate GNODE2 of the second transistor NTR2.

The operation of the output driver 400, according to embodiments of the present invention, are illustrated with reference to example FIG. 4. The principle of embodiments of the present invention is to eliminate coupling noise (introduced at the gate GNODE2 of the second transistor NTR2 at a channel side of the output driver 400 when voltages at nodes of the output driver 400 are pulled up or down) by offsetting the generated coupling noise by an 180° out-of-phase coupling noise.

It is illustrated in example FIG. 4 that the direction of voltage change at the gate GNODE1 of the first transistor NTR1 (to which the data DATA is applied) is opposite to the direction of voltage changes at the first node N1 and the output node ONODE. In other words, once the data DATA of a high level is applied, the voltage at the gate GNODE1 of the first transistor NTR1 increases, while the voltages at the first node N1 and the output node ONODE decrease, because the first transistor NTR1 is turned on.

Utilizing this operating principle, the noise-eliminating portion 410 is connected between the gate GNODE1 of the first transistor NTR1 and the gate GNODE2 of the second transistor NTR2. In embodiments, the noise-eliminating portion 410 is a capacitor. By adding a capacitor (having an appropriate capacitance) between the gate GNODE1 of the first transistor NTR1 and the gate GNODE2 of the second transistor NTR2, most coupling noise introduced at the gate GNODE2 of the second transistor NTR2 from the first node N1 and the output node ONODE can be offset.

When the data DATA of a high level is applied, the voltage at the first node N1 decreases by about 500 mV and the voltage at the output node ONODE decreases by about 800 mV. Absent the noise-eliminating portion 410, the gate GNODE2 of the second transistor NTR2 undergoes a voltage drop due to coupling noise. When the data DATA of a high level is applied, the voltage at the gate GNODE1 of the first transistor NTR1 increases. Accordingly, the noise-eliminating portion 410 (e.g. the capacitor) is charged. As a consequence, the voltage at the gate GNODE2 of the second transistor NTR2 is maintained at a substantially constant level.

The sizes of the first transistor NTR1 and the second transistor NTR2 of the output driver 400 of example FIG. 4 may be large. However, the size of the noise-eliminating portion 410, (e.g. the size of the capacitor) may not necessarily be large in comparison to the first transistor NTR1 and the second transistor NTR2. The output node ONODE and the first node N1 may experience a voltage swings of 500 mV –800 mV, but the gate GNODE1 of the first transistor NTR1 to which the data DATA is applied experiences a full swing from the supply voltage VDD to the ground voltage VSS. Thus, coupling noise introduced at the gate GNODE2 of the second transistor NTR2 can be adequately offset using a relatively small capacitor.

When coupling noise introduced at the gate GNODE2 of the second transistor NTR2 is offset according to embodiments of the present invention, the capacitance of a capacitor C between the gate GNODE2 of the second transistor NTR2 and the ground voltage VSS can be reduced, preserving layout space.

Figure 1:
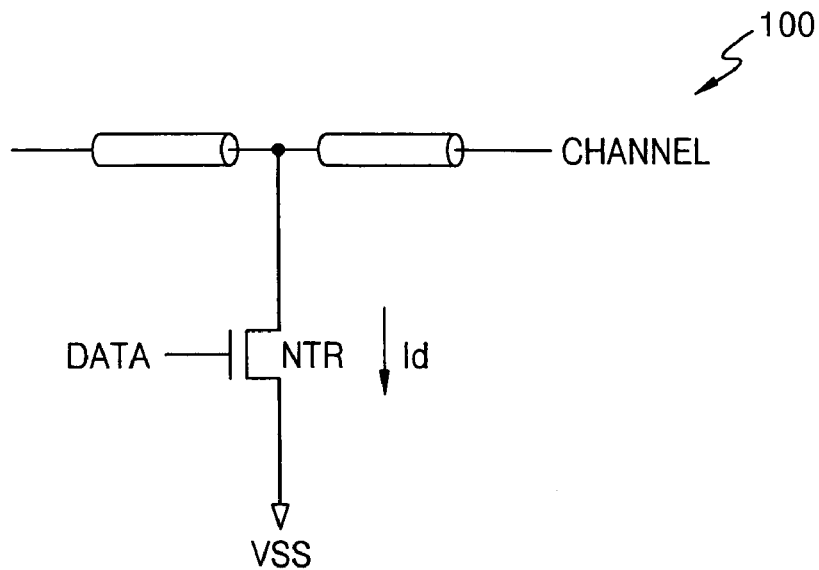
FIG. 1 is a circuit diagram of a current-mode output driver.
Figure 2:
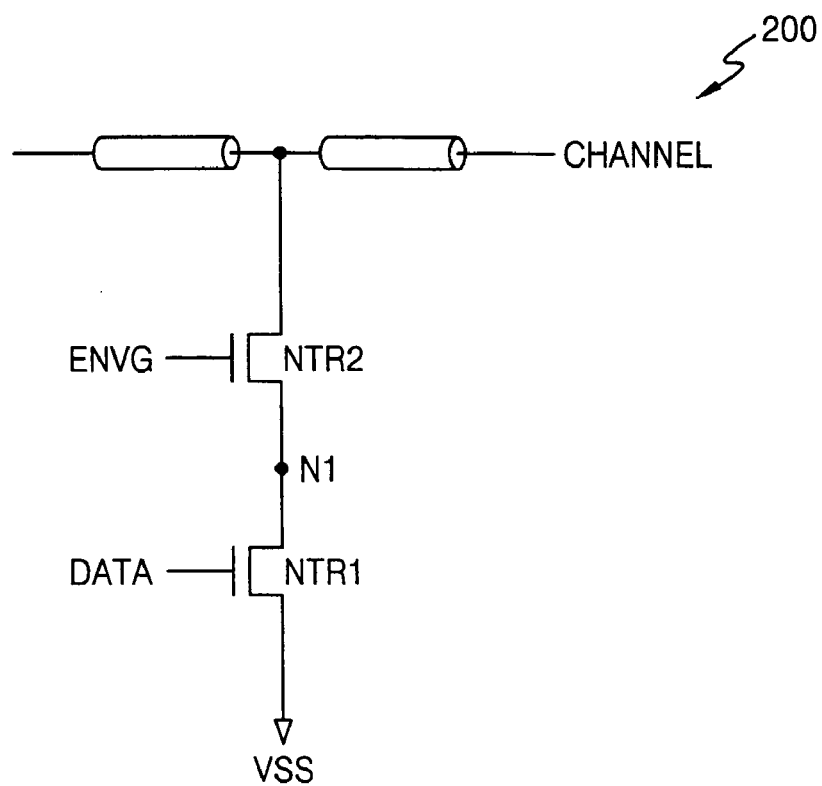
FIG. 2 is a circuit diagram of a stacked current-mode output driver.
Figure 3:
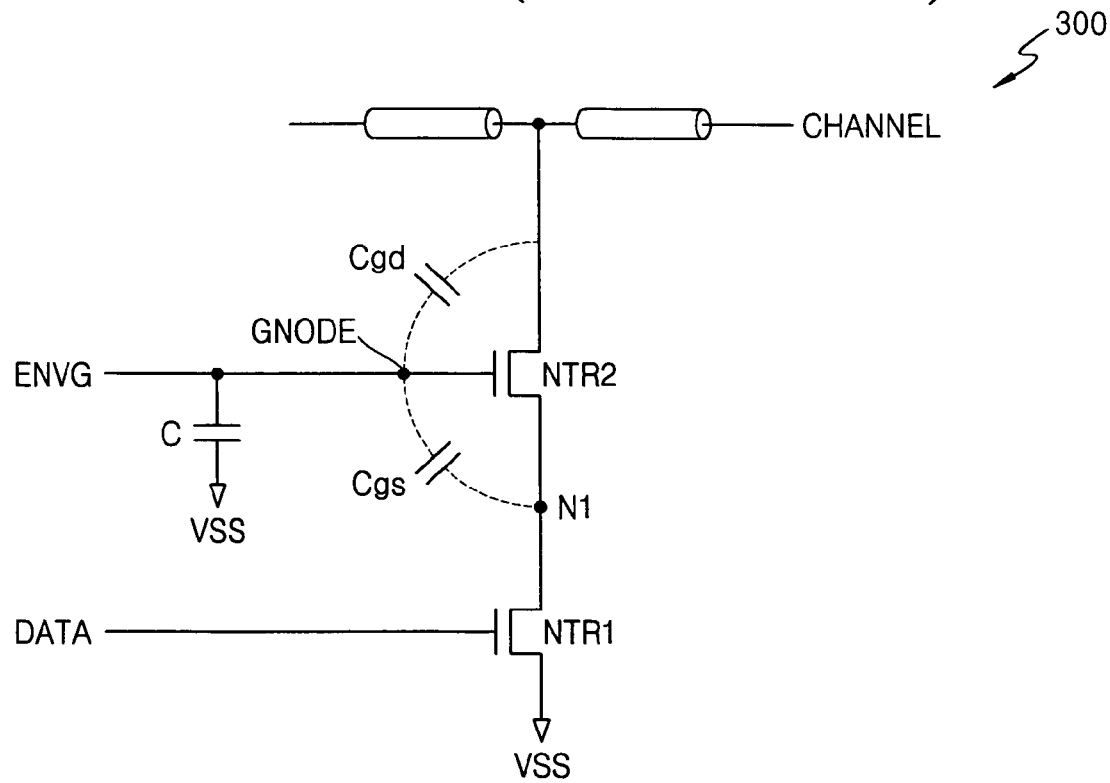
FIG. 3 is a circuit diagram illustrating coupling noise generated in the stacked current-mode output driver of FIG. 2.

Example FIG. 5A is an example graph showing change in a waveform output from a gate of a second transistor due to coupling noise when using a current-mode output driver similar to FIG. 3. Referring to example FIG. 5A, the voltage at the gate GNODE2 of the second transistor NTR2 of example FIG. 3 changes significantly due to the coupling noise.

Example FIG. 5B is an example graph showing change in a waveform output from the gate GNODE2 of the second transistor NTR2 of the output driver 400 according to embodiments of the present invention, in which coupling noise is substantially eliminated. Referring to example FIG. 5B, the coupling noise is offset by the noise-eliminating portion 410 and the voltage at the gate GNODE2 of the second transistor NTR2 is maintained substantially stable.

An output driver which reduces coupling noise, according to embodiments of the present invention, is described below with reference to example FIG. 4. An output driver 400, according to embodiments of the present invention, includes a first transistor NTR1 and a second transistor NTR2 that are serially connected between a first voltage VSS and an output node ONODE. The output driver 400, according to embodiments of the present invention, also includes a noise-eliminating portion 410 for eliminating coupling noise introduced at a gate GNODE2 of the second transistor NTR2. The noise-eliminating portion 410 is connected between a gate GNODE1 of the first transistor NTR1 and the gate GNODE2 of the second transistor NTR2. In embodiments, the noise-eliminating portion 410 is a capacitor.

A output driver which reduces coupling noise, according to embodiments of the present invention, is described below with reference to example FIG. 4. An output driver 400, according to embodiments of the present invention directs data DATA input to an input node GNODE1 to an output node ONODE. The output driver 400, according to embodiments of the present invention, includes a first node N1, a first driver NTR1, a second driver NTR2, and a noise-eliminating portion 410. The first driver NTR1 is connected between the first node N1 and a first voltage VSS and directs the data DATA input to the input node GNODE1 to the output node ONODE through the first node N1. The voltage at the first node N1 is a ground voltage. The second driver NTR2 is connected between the output node ONODE and the first node N1. The second driver NTR2 connects the first node N1 and the output node ONODE in response to a gate voltage ENVG applied to a control node GNODE2. The noise-eliminating portion 410 is connected between the input node GNODE1 and the control node GNODE2 and substantially eliminates coupling noise introduced at the control node GNODE2. In embodiments, the noise-eliminating portion 410 is a capacitor.

By using the data DATA applied to the input node GNODE1, the capacitor may substantially eliminate coupling noise that is introduced at the control node GNODE2 of the second driver NTR2 due to coupling capacitance Cgd (between the control node GNODE2 of the second driver NTR2 and the output node ONODE) and coupling capacitance Cgs (between the control node GNODE2 of the second driver NTR2 and the first node N1).

A method of reducing coupling noise, according to embodiments of the present invention, will now be described with reference to example FIG. 4. The method of reducing coupling noise involves outputting the data DATA input to the input node GNODE1 to the output node ONODE in response to the gate voltage ENVG applied to the control node GNODE2 and substantially eliminates coupling noise introduced at the control node GNODE2. First, in embodiments, the capacitor is connected between the control node GNODE2 and the input node GNODE1, substantially eliminating coupling noise introduced at the control node GNODE2. Next, in embodiments, the data DATA input to the input node GNODE1 is output to the output node ONODE through the first node N1. By connecting the capacitor between the control node GNODE2 and the input node GNODE1, coupling noise introduced at the control node GNODE2 can be substantially eliminated using the data DATA applied to the input node GNODE1.

As described above, an output driver with reduced coupling noise and a method of reducing coupling noise are disclosed, according to embodiments of the present invention. Coupling noise that is introduced at a gate of a transistor connected to a channel of the output driver may be eliminated, thereby stabilizing output timing of data. Also, in embodiments, a capacitance of a capacitor connected between the gate of the transistor connected to the channel of the output driver and a ground voltage can be reduced.

While the present invention has been particularly shown and described with reference to example embodiments, it will be understood by those of ordinary skill in the art that various changes in form and details may be made therein without departing from the spirit and scope of the invention as defined by the appended claims and their equivalents.

What is claimed is:

1. An output driver with reduced coupling noise, comprising:
    a first NMOS transistor, comprising a first source terminal connected to a first voltage, a first drain terminal connected to a first node, and a first gate adapted to receive a data signal;
    a second NMOS transistor, comprising a second source terminal connected to the first node and a second drain terminal connected to an output node, and a second gate adapted to receive a gate voltage; and
    a noise-eliminating portion connected between the first and second gates.

2. The output driver of claim 1, wherein the noise-eliminating portion is capacitor.

3. The output driver of claim 2, wherein the capacitor substantially eliminates coupling noise introduced at the gate of the second transistor, due to coupling capacitance between the gate of the second transistor and the output node and coupling capacitance between the gate of the second transistor and the first node, in response to the data signal applied to the first gate.

4. The output driver of claim 1, wherein the first voltage is a ground voltage.

5. An output driver adapted to transfer data input to an input node to an output node connected to a channel with reduced coupling noise, comprising:
    a first node;
    a first NMOS driver, comprising a first gate connected to the input node, a first drain connected to the first node, and a first source connected to a first voltage, the first NMOS driver being adapted to drive the data input to the input node to the output node through the first node;
    a second NMOS driver, comprising a second drain connected to the output node, a second source connected to the first node, and a second gate connected to a control node and adapted to receive a gate voltage; and
    a noise-eliminating portion connected between the input node and the control node and adapted to substantially eliminate coupling noise introduced at the control node.

6. The output driver of claim 5, wherein the noise-eliminating portion is a capacitor.

7. The output driver of claim 6, wherein the capacitor substantially eliminates coupling noise introduced at the control node, due to:
    coupling capacitance between the control node and the output node; and
    coupling capacitance between the control node and the first node, in response to the data applied to the input node.

8. The output driver of claim 5, wherein the first voltage is a ground voltage.

9. A current mode output driver adapted to present an impedance to a channel that varies with a drain current, the output driver comprising:
    first and second NMOS transistors serially connected source to drain between an output node of the output driver and a ground voltage, and defining to a path for the drain current, wherein the first NMOS transistor comprises a first gate adapted to receive a data signal and the second NMOS transistor comprises a second gate adapted to receive a gate voltage; and
    a capacitor connected between the first and second gates and adapted to reduce coupling noise introduced at the second gate;
    wherein the capacitance of the capacitor and the drain current flowing through the serially connected first and second NMOS transistors vary in accordance with the data signal.

10. The output driver of claim 9, wherein the capacitor substantially eliminates coupling noise introduced at the gate of the second transistor due to coupling capacitance between the second gate and at least one of the output node and the first node.

11. The output driver of claim 9, wherein the data signal varies between a ground voltage VSS and a supply voltage VDD.

12. A method of driving data onto an output node connected to a channel, comprising:
    varying the impedance of the output node in response to a drain current flowing through a path between the output node and a ground voltage;
    wherein the path comprises;
    first and second NMOS transistors serially connected source to drain, wherein the first NMOS transistor comprises a first gate adapted to receive a data signal and the second NMOS transistor comprises a second gate adapted to receive a gate voltage, and
    a capacitor connected between the first and second gates and adapted to reduce coupling noise introduced at the second gate; and,
    controlling the flow of drain current in response to the data signal and the gate voltage.

13. The method of claim 12, wherein the capacitor substantially eliminates coupling noise introduced at the gate of the second transistor due to coupling capacitance between the second gate and at least one of the output node and the first node.

14. The output driver of claim 12, wherein the data signal varies between a ground voltage VSS and a supply voltage VDD.

* * * * *